United States Patent [19]

Houston et al.

[11] Patent Number: 5,107,139
[45] Date of Patent: Apr. 21, 1992

[54] ON-CHIP TRANSIENT EVENT DETECTOR

[75] Inventors: Theodore W. Houston, Richardson; Hsindao E. Lu; Terence G. Blake, both of Dallas, all of Tex.

[73] Assignee: Texas Instruments Incorporated, Dallas, Tex.

[21] Appl. No.: 502,393

[22] Filed: Mar. 30, 1990

[51] Int. Cl.$^5$ .......................... H03K 5/00; H03K 3/26
[52] U.S. Cl. ............................. 307/296.5; 365/195; 307/310
[58] Field of Search ............... 307/296.5, 310–311, 307/591–592; 365/194–195, 228

[56] References Cited

U.S. PATENT DOCUMENTS

| | | | |
|---|---|---|---|
| 4,730,228 | 3/1988 | Einzinger et al. | 307/310 |
| 4,837,744 | 6/1989 | Marquot | 365/195 |
| 4,864,541 | 9/1989 | Marquot | 365/195 |
| 4,908,799 | 3/1990 | Gaudronneau | 365/195 |
| 4,910,707 | 3/1990 | Schrenk | 307/310 |

Primary Examiner—David Hudspeth
Assistant Examiner—Andrew Sanders
Attorney, Agent, or Firm—Richard A. Stoltz; Douglas A. Sorensen; Richard L. Donaldson

[57] ABSTRACT

An on-chip transient event detector (FIG., 1) is fabricated onto an integrated circuit chip to provide rapid response to a detected event, such as a transient radiation dose or other condition that can cause transient current pulses. The transient event detector includes a detector circuit 10 that includes a narrow p-channel FET (12), and a wide n-channel FET (14). These detector transistors are coupled together and biased so that the narrow-channel transistor is normally on and the wide-channel transistor is normally off. A transient event, such as a photocurrent induced by radiation, causes a current pulse in the normally off wide-channel transistor that is sufficiently greater than the current in the narrow-channel transistor to cause a change in logic output, providing an event signal. The event signal can be used to disable memory WRITE operations during the transient event. The detector circuit can be integrated with an on-chip time-delay circuit (30) to provide a time-delayed system reset signal.

32 Claims, 1 Drawing Sheet

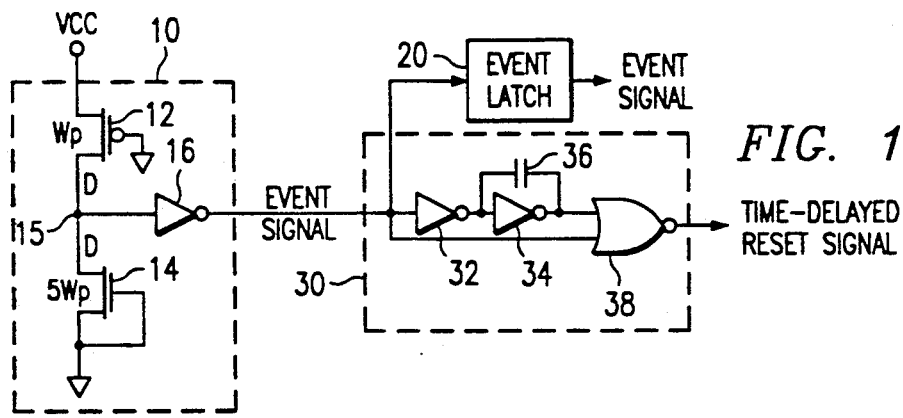
FIG. 1
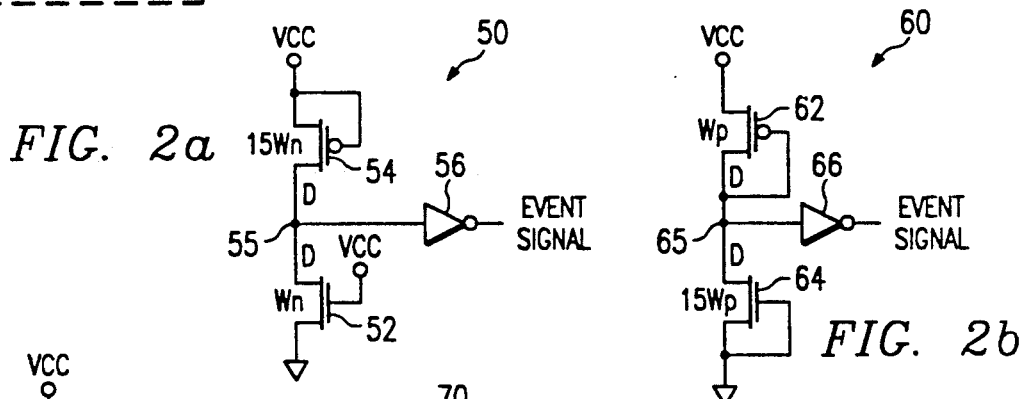
FIG. 2a
FIG. 2b
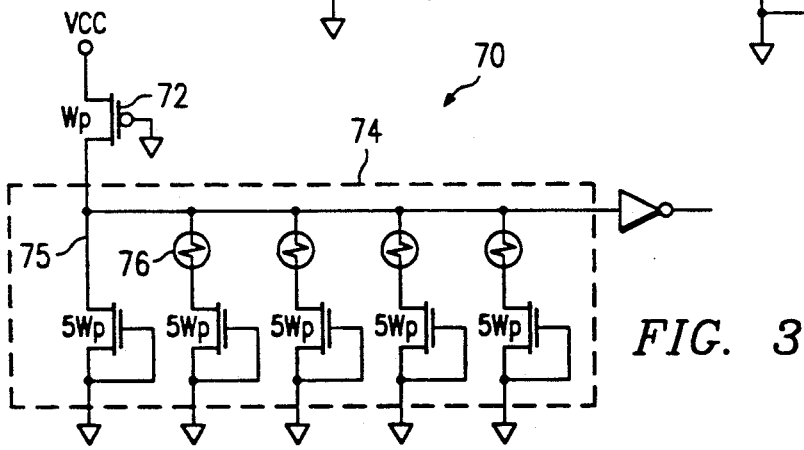
FIG. 3
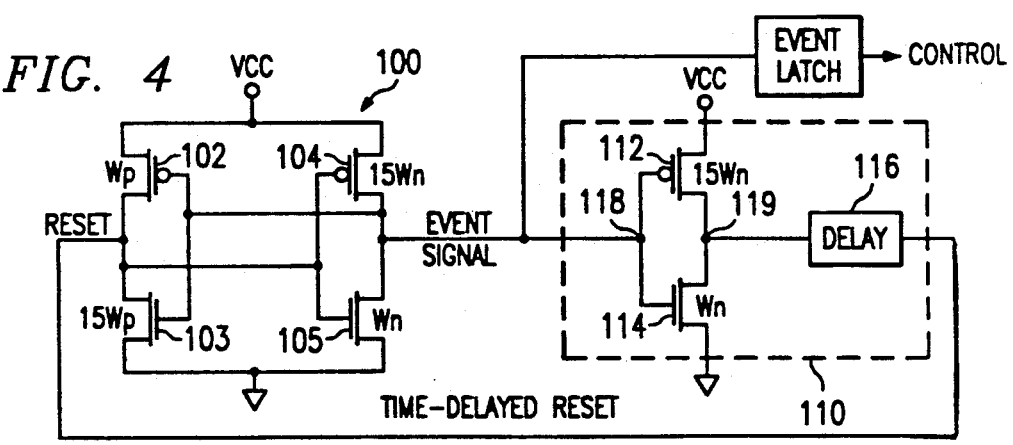
FIG. 4

ON-CHIP TRANSIENT EVENT DETECTOR

TECHNICAL FIELD OF THE INVENTION

This invention relates to integrated circuits, and more particularly to a circuit and method for on-chip transient event detection.

RELATED APPLICATION

This application relates to copending U.S. patent application Ser. No. 395,853 (Attorney's Docket No. TI-14178), titled "On-Chip Error Detection Circuit", which was filed Aug. 18, 1989, and is assigned to the assignee of this invention. The subject matter disclosed in this related application is incorporated into this application by reference.

BACKGROUND OF THE INVENTION

Integrated circuits can be adversely affected by rapid and unpredictable environmental changes, such as bursts of radiation or high temperatures. Of particular concern in military applications is the data corruption that can occur due to extraneous memory write errors resulting from a transient dose.

The term transient dose is used to describe the effect on an integrated circuit of a burst of radiation, such as x-ray and gamma ray radiation from a nuclear explosion. A photocurrent pulse can be induced when such radiation generates electron-hole pairs that are separated by ambient electric fields.

At high enough levels, a radiation dose can cause data corruption due to photocurrent in the memory cells and/or a lowering of supply voltage to the cells due to total chip photocurrent. In addition, false memory WRITEs can be caused by transient dose induced noise at the input to the memory chip that is coupled into memory write circuits, causing extraneous WRITE operations that corrupt data stored in the memory.

Current efforts to protect sensitive integrated circuit components from transient dose effects focus on off-chip transient dose detectors designed to detect a radiation burst. The detector provides an event signal to a controller, which responds by disabling memory WRITE operations. Typically, the detector includes means to cause the system to reboot after event detection and WRITE disable.

A problem with current off-chip approaches to transient dose detection is response time—the time for event detection, event signaling and WRITE disable is such that a significant number of extraneous data-corrupting WRITEs can still occur. An additional problem is controller reliability in a transient dose environment.

Accordingly, a need exists for an integrated circuit mechanism to improve the response time for detecting transient events, such as for the purpose of disabling memory WRITE operations before any significant number of data-corrupting WRITE operations occur. Preferably, such a transient event detector could be configured to provide asymmetrical control, allowing rapid event detection and response followed by time-delayed system reset.

SUMMARY OF THE INVENTION

The invention is an on-chip transient event detector that is fabricated onto an integrated circuit chip to provide rapid response to a detected event, such as a transient radiation dose, and can be integrated with an on-chip time-delay circuit to provide selectively time-delayed system reset after a detected event.

In one aspect of the invention, the on-chip transient event detector provides an event signal upon the occurrence of a transient event, causing a current pulse condition in the integrated circuit chip, such as a transient radiation dose. It includes a detector circuit fabricated on the integrated circuit chip for placing the integrated circuit into a predetermined protected state during a current pulse condition. The detector circuit is responsive to the end of the transient event to return the integrated circuit to normal operation.

In another aspect of the invention, the on-chip transient event detector includes at least one narrow-channel transistor with a relatively narrow channel of a first conductivity type, and at least one wide-channel transistor with a relatively wide channel of a second conductivity type.

These detector transistors are coupled together and biased so that the narrow-channel transistor is normally on and the wide-channel transistor is normally off. When a transient event creates channel electron-hole pairs, the resulting photocurrent in the wide-channel transistor is sufficiently greater than the photocurrent and on-current in the narrow-channel transistor to cause a change in the output logic level, providing an event signal.

The event signal can be used for various control purposes, such as disabling memory WRITE operations to prevent photocurrent-induced memory WRITE operations that corrupt data in the memory.

In more specific aspects of the invention, the transient event includes an inverter that sharpens the transition to an event signal condition. In addition, the transient event detector can be integrated with an event latch or register for storing an event indication, and with a time-delay circuit for providing a reset signal a predetermined time after an event condition is over (and the event signal has terminated).

In one specific implementation of the transient event detector circuitry, the narrow-channel transistor is a p-channel FET coupled gate-to-ground and source-to-VCC, and the wide-channel transistor is an n-channel FET coupled gate-to-ground and source-to-ground, with the transistors being coupled drain-to-drain so that the event signal output appears on the drains.

In one embodiment, detection-threshold adjustment can be provided by incorporating multiple parallel FETs, each of which can be selectively coupled (such as with a fusible link) to form a wide-channel transistor. By selecting the number of such parallel FETs used to provide the wide-channel component of the detector, a composite wide-channel width can be established, thereby controlling the threshold level of photocurrent necessary to cause an event signal.

In another embodiment, an on-chip bi-stable transient event detector includes two narrow-channel transistors with relatively narrow channels of opposite conductivity types, and two wide-channel transistors with relatively wide channels of opposite conductivity types. These transistors are connected in a bi-stable flip-flop configuration and biased so that the wide-channel transistors are normally off. When a transient event occurs, the photocurrent in the wide-channel transistors causes the bi-stable detector to switch states and provide an event signal.

The technical advantages of the invention include the following. The transient event detector is fabricated on-chip, allowing rapid response to a transient event, such as a transient radiation dose, and improving reliability. When used to invoke a memory protect mode, the transient event detector enables the system to rapidly disable memory WRITE operations to avoid data-corrupting memory WRITEs. The transient event detector can be integrated with an on-chip time-delay circuit for providing a selectively time-delayed system reset signal after a transient event is detected. The detector circuitry uses FET transistors fabricated with both narrow and wide channels, taking advantage of a larger induced photocurrent in the wide channel than in the narrow channel to provide event detection. The transient event detector can be implemented with a variety of circuit configurations, including using multiple parallel transistors which can be selectively coupled (such as by fusible link) into the detector to determine the threshold transient event detection level.

BRIEF DESCRIPTION OF THE DRAWINGS

For a more complete understanding of the invention, and for further features and advantages, reference is now made to the following Detailed Description of an exemplary embodiment of the invention, taken in conjunction with the accompanying Drawings, in which:

FIG. 1 schematically illustrates an exemplary embodiment of the transient event detector of the invention, integrated with a time-delay circuit.

FIGS. 2a-2b schematically illustrate alternative implementations for the detector circuitry.

FIG. 3 schematically illustrates an implementation in which the wide-channel is formed by the channels of multiple parallel FETs that can be selectively coupled through fusible links into the detector to establish a total channel width.

FIG. 4 is an exemplary circuit implementation using a bi-stable circuit for event detection, together with a time-delay circuit.

DETAILED DESCRIPTION OF THE INVENTION

The Detailed Description of exemplary embodiments of the on-chip transient event detector of the invention is organized as follows:
1. Transient Event Detector
2. Alternative Detector Circuits
3. Detection Threshold Adjustment
4. Bi-stable Transient Event Detector
5. Conclusion This Detailed Description incorporates by reference subject matter disclosed in the related application.

1. Transient Event Detector. For the exemplary embodiments, the on-chip transient event detector is used to detect a transient dose resulting from a burst of radiation, and provides an event signal at the occurrence of such an event. The event signal is latched and used to disable memory WRITE operations. The detector is integrated with a time-delay circuit that provides a system reset signal at a predetermined time after the transient event.

FIG. 1 illustrates an exemplary transient event detector, implemented by a detector circuit 10 with a relatively narrow p-channel FET 12 and a relatively wide n-channel FET 14. The narrow-channel/wide-channel relationship is illustrated by designating the width of the narrow p-channel as $W_p$ and the width of the wide n-channel as $15W_p$.

Narrow-channel FET 12 is coupled gate-to-ground and source-to-VCC. Wide-channel FET 14 is coupled gate-to-ground and source-to-ground. The FET drains are coupled together at node 15.

Node 15 is coupled to an inverter 16. The output logic level of the inverter is the event signal output of detector circuit 10.

The event signal output from inverter 16 is applied to an event latch 20 and to a time-delay circuit 30. Time-delay circuit 30 includes two delay-line inverters 32 and 34, with a capacitor 36 coupled between the input and output of inverter 34. The event signal is applied directly to one input to a NOR gate 38, with the other NOR gate input receiving a delayed event signal through the delay-line inverters.

In operation, the detector FETs are biased such that narrow p-channel FET 12 is normally on and the wide n-channel FET 14 is normally off. In this non-event state, node 15 is normally high (pulled up by FET 12), making the output logic level of inverter 16 (i.e., of detector circuit 10) normally low.

When a radiation burst causes a transient dose event to occur, electron-hole pairs are generated in the channels of the detector FETs 12 and 14. These electron-hole pairs are separated in the electrical fields of the circuit, inducing a photocurrent. As described in the Background, extraneous photocurrents are being induced throughout the integrated circuit, with one problem being photocurrents coupled into the memory WRITE circuitry, causing erroneous memory WRITE operations and attendant data corruption.

Because the n-channel of FET 14 is significantly wider than the p-channel of FET 12, the photocurrent induced in the n-channel FET is significantly greater than the photocurrent induced in the p-channel FET. This larger photocurrent in n-channel FET 14 overrides the combined biasing and photocurrent effect of p-channel FET 12, causing the drain voltage (node 15) to become nearer to ground than VCC.

When node 15 is brought low, the logic level output from inverter 16 switches high, providing an event signal notification of the transient dose. The inverter functions to sharpen the transition from a non-event to an event state. This use of inclusion of transition-sharpening circuitry is a design choice -- a more elaborate circuit, such as a Schmitt trigger, could be used, or, alternatively, this function could be eliminated altogether.

The event signal is latched into event latch 20, providing an indication of the occurrence of a transient dose. The system controller (not shown) can interrogate the latch to determine if an event has been detected. The event signal is also input to event protection circuitry (not shown), such as for the purpose of immediately disabling all memory WRITE operations to prevent photocurrent-induced memory WRITEs.

The duration of the event signal output of event detector circuit 10 is dependent upon the duration of the photocurrent, which in turn is dependent upon the duration of the transient event (the radiation burst in the example). When the transient dose terminates, the associated electron-hole pair generation ceases, terminating the photocurrent. Photocurrent termination causes detector circuit 10 to return to its normal bias state, bringing node 15 high and causing the event signal output of inverter 16 to transition low (non-event state), thereby terminating the event signal.

For the exemplary embodiment in FIG. 1, the event signal output of detector circuit 10 is applied to time-delay circuit 3. The output of the time delay circuit from NOR-gate 38 provides a system reset signal that is delayed a predetermined time after the return of the detector circuit to the non-event state.

In the non-event state (prior to the receipt of an event signal), both NOR gate inputs are low, and the NOR gate output is high, corresponding to the non-event output from detector circuit 10.

When the transient event occurs, the event signal input to time-delay circuit 30 from detector circuit 10 switches high. The event signal is applied directly to NOR gate 38, so that one NOR gate input is brought high by the event-signal leading edge, while the input fed by the delay-line inverters 32/34 remains low. NOR gate 38 immediately transitions low on the leading edge of the event signal to provide an indication of the beginning of a triggering event.

The event signal is also applied to NOR gate 38 after propagating through delay-line inverters 32 and 34, with capacitor 36 providing a Miller capacitance effect that delays the transitioning of inverter 34. Thus, the event signal is delayed by a predetermined amount corresponding to the delay introduced by inverters 32/34 and capacitor 36.

After the predetermined delay, the leading edge of the event signal is applied to NOR gate 38, bringing its corresponding input high (the other input is still high from the undelayed event signal). With both inputs high, the output of NOR gate 38 remains low.

When the trailing edge of the undelayed event signal reaches NOR gate 38, the corresponding input is brought low, while the other NOR gate input is still high as a result of the time-delayed event signal, so that the NOR gate output remains low. When the time-delayed trailing edge of the event signal through the delay-line inverters reaches NOR gate 38, both NOR gate inputs are low, and the NOR gate transitions high, providing a time-delayed reset signal.

Thus, as a result of the operation of time-delay circuit 30, the event signal pulse is effectively widened so that its duration is extended by the amount of the predetermined delay introduced by the delay-line inverters and the capacitor. The trailing edge of this extended event signal pulse provides a return-to-normal indication that can, for example, be used to re-enable memory WRITE operations.

Selecting the specific implementation for the detector circuit in accordance with the transient event detection technique of the invention is a design choice. Alternative implementations are discussed in Sections 2, 3 and 4.

Selecting the channel widths for the p-channel and n-channel FETs is a design choice depending upon a desired photocurrent threshold level for triggering an event signal. For a given channel width ratio, the threshold event detection level will depend upon the relationship between the photocurrent and normal mode conduction. The channel width ratio of $W_p:15W_p$ is for illustrative purposes only. Typically, the width of the wide channel will be 5 to 15 times the width of the narrow channel. For example, in the case of 1 micron gate-length technology, normal channel widths are 2-3 microns, so that wide channel widths might be 10-45 microns. In addition, as described in Section 3, the detection threshold can be made selectable after fabrication of the transient event detector by using multiple FETs selectably configured to form a composite-width channel.

Implementing a time-delay circuit for use in the transient event detector of the invention is a design choice, and the specific circuit implementation illustrated in FIG. 1 is illustrative only. In that illustrative implementation, an appropriate time-delay is determined by selecting the number of pipeline-delay inverters, as well as the level of Miller capacitance, and depends upon the delay being less than the actual duration of the event signal (as determined by the duration of the transient-dose photocurrent). Further time delay can be achieved by adding one or more additional time-delay stages to further extend the duration of the event signal pulse.

2. Alternative Detector Circuits. Alternative circuit implementations for detector circuit 10 in FIG. 1 are shown in FIGS. 2a-2b.

FIG. 2a illustrates an alternative detector circuit 50, which is a complementary implementation with a relatively narrow n-channel FET 52 and a relatively wide p-channel FET 54. The narrow-channel/wide-channel relationship is illustrated by designating the width of the narrow n-channel as $W_n$ and the width of the wide p-channel as $15W_n$.

Narrow-channel FET 52 is coupled gate-to-VCC and source-to-ground. Wide-channel FET 54 is coupled gate-to-VCC and source-to-VCC. The FET drains are coupled together at node 55.

Node 55 is coupled to an inverter 56. The logic level output of the inverter is the event signal output of the detector circuit 50.

In operation, the detector FETs are biased such that narrow n-channel FET 52 is normally on and wide p-channel FET 54 is normally off. In this non-event state, the logic level output of the inverter is normally low. When a transient dose is received, the photocurrent induced in the wide-channel FET 54 is significantly greater than the photocurrent induced in the narrow-channel FET 52, and node 55 is brought low. In response, the logic level output of inverter 16 switches high, providing an event signal notification of the transient dose.

FIG. 2b illustrates an alternative detector circuit 60 that includes a relatively narrow ($W_p$) p-channel FET 62 and a relatively wide ($W_p$) n-channel FET 64.

Narrow-channel FET 62 is coupled gate-to-drain and source-to-VCC, to act as a current source. Wide-channel FET 64 is coupled gate-to-ground and source-to-ground. The FET drains are coupled together at node 65.

Node 65 is coupled to an inverter 66. The logic level output of the inverter is the event signal output of detector circuit 60.

In operation, the detector FETs are biased such that narrow p-channel FET 62 is normally on and the wide n-channel FET 64 is normally off. In this non-event state, node 65 is high, and the logic level output of the inverter is low. When a transient dose is received, the photocurrent induced in the narrow-channel FET 54 is significantly greater than the photocurrent induced in the wide-channel FET 52, and node 65 is brought low. In response, the logic level output of inverter 16 switches high, providing an event signal notification of the transient dose.

Compared to this detector implementation, the implementation illustrated in FIG. 1 provides a cleaner logic level in the non-event state for later stages of the transient event detector because the node 15 is pulled to VCC, rather than to a threshold voltage drop below VCC.

3. Detection Threshold Adjustment. The event detection threshold can be made selectable after fabrication by forming the wide-channel FET (p or n) from multiple transistors that can be selectably connected into the detector circuit.

FIG. 3 illustrates an exemplary detector circuit implementation 70, which is equivalent to the detector circuit implementation illustrated in FIG. 1 except that the narrow n-channel FET is formed by a selectable combination of transistors. Detector circuit 70 includes a narrow p-channel FET 72 and multiple n-channel FETs 74, each coupled in parallel drain-to-drain to the p-channel FET (node 75) through respective fusible links 76.

The channel-width relationship between the FETs is represented by the designations $W_p$ for the p-channel FET and, as an example, $5W_p$ for each of the n-channel FETs. Since the n-channel FETs are coupled in parallel, channel widths effectively add. For example, a channel width of $15W_p$ such as illustrated for the exemplary implementation in FIG. 1 can be achieved by incorporating three of the n-channel FETs into detector circuit 70.

To configure detector circuit 70 for a predetermined event detection threshold, selected ones of links 76 are fused to couple the associated n-channel FETs 74 to p-channel FET 72, thereby incorporating them into the detector circuit. After configuration, in operation, the event detection threshold will be determined by the composite n-channel widths presented by the fused/-coupled n-channel FETs.

4. Bi-stable Transient Event Detector. A bi-stable implementation of the transient event detector of the invention can be used to provide a sharper transition to an event detection condition.

FIG. 4 illustrates a bi-stable transient event detector, which includes a bi-stable detector circuit 100. Bi-stable detector circuit 100 includes a narrow ($W_p$) p-channel FET 102, a wide ($15W_p$) n-channel FET 103, a wide p-channel FET ($15W_n$) 104, and a narrow n-channel FET ($W_n$) 105. These FETs are coupled in a conventional bi-stable flip-flop configuration with cross-coupled inverter pairs—FETs 102/103 and FETs 104/105. A drain node 106 between FETs 104/105 is the event signal output for the bi-stable flip-flop, with drain node 107 between FETs 102/103 being used for reset.

The event signal output from bi-stable detector circuit 100 is applied to a time-delay circuit 110, which includes an inverter-pair of FETs 112 and 114, and a delay element 116.

Narrow ($W_p$) p-channel FET 112 is coupled source-to-VCC, while wide ($15W_p$) n-channel FET 114 is coupled source-to-ground. The FET gates are coupled together at an input node 118 and the FET drains are coupled together at an output node 119.

The logic level output from node 119 feeds into time-delay element 116. The time-delayed output of the time-delay element is applied to the reset node 107 of bi-stable detector circuit 100.

In operation, in the non-event state, the wide-channel FETs 103 and 104 are off, and the output of bi-stable detector circuit 100 at output node 106 is low. In the time-delay circuit 110, the wide n-channel FET 114 is also off, so that its output node 119 is high.

When a transient dose is received, the induced photocurrents cause the bi-stable flip-flop to switch states, driving output node 106 high and providing an event signal. The event signal output of bi-stable detector circuit 100 is applied to the gates of the inverter-pair FETs 112/114 in time-delay circuit 110.

The inverter-pair FETs 112/114 function as an inverter that does not respond to the event signal output from bi-stable detector circuit 100 until after the photocurrent pulse caused by the event terminates. That is, the transient event that causes a photocurrent pulse in the bi-stable flip-flop, which results in an event signal (low-to-high) being applied to the gate of wide p-channel FET 112, also causes a photocurrent pulse in that FET which is greater than the on-current in the narrow n-channel FET 114, preventing the inverter-pair from switching logic states. When the transient event ends, terminating the photocurrent, the output from inverter-pair FETs 112/114 at node 119 changes logic states (high-to-low), providing an event signal to time delay element 116. The bi-stable flip-flop 100 remains in the same state until a reset signal is received from time-delay element 116.

An alternative configuration for bi-stable detector circuit 100 is described in the related application, which is incorporated by reference. Instead of implementing a detector circuit using wide channel FETs, this alternate circuit uses multiple narrow channel FETs in parallel on one leg (coupled gate-to-ground) of the bi-stable flip-flop, such that a transient event induces a combined photocurrent that causes the bi-stable flip-flop to switch. The bi-stable flip-flop is reset by an off-chip circuit.

5. Conclusion. The on-chip transient event detector of the invention enables an event signal to be provided in response to a transient event, such as a transient dose caused by radiation. The transient event detector is fabricated on-chip for improved response time and reliability. An event detector circuit is configured from narrow and wide channel FETs, such that event-induced currents, which are proportional to channel width, cause the event detector circuit to change logic states in response to the triggering event. The transient event detection technique is adaptable to a number of different detector circuit configurations using narrow/-wide channel FETs. The detector circuit implementations can be integrated with on-chip time-delay circuitry to provide a system reset signal with a predetermined time-delay.

The exemplary embodiments are described in relation to a transient event detector for detecting a transient dose, such as would be caused by a radiation burst. The invention is adaptable to event detection for a high temperature condition that causes leakage currents, or any other event that induces extraneous current pulses whose magnitude is proportional to channel width.

Although the invention has been described with respect to specific, exemplary embodiments, various changes and modifications may be suggested to one skilled in the art, and it is intended that the invention encompass such changes and modifications as fall within the scope of the appended claims.

What is claimed is:

1. An integrated circuit with an on-chip transient event detector for providing an event signal upon the occurrence of a transient event in which a radiation pulse causes a current pulse condition in the integrated circuit chip, said integrated circuit comprising:

the on-chip transient event detector circuit fabricated on the integrated circuit chip for placing the integrated circuit into a predetermined protected state during a current pulse condition, with said detector circuit being responsive to the end of the transient event to return the integrated circuit to normal operation; and a time-delay circuit, connected to said transient event detector, for returning the integrated circuit to normal operation a predetermined time after the end of the transient event, and said time-delay circuit comprising a first invertor a second invertor, a nor gate and a capacitor connected from the input of said second invertor to the output of said second invertor.

2. The integrated circuit with an on-chip transient event detector of claim 1, wherein the integrated circuit includes a memory, wherein the predetermined state inhibits WRITE to the memory.

3. An on-chip transient event detector for providing an event signal upon the occurrence of a transient event causing a current pulse condition in the integrated circuit chip, comprising:

at least one narrow-channel detector transistor fabricated onto the chip with a relatively narrow channel of a first conductivity type; and at least one wide-channel detector transistor fabricated onto the chip with a relatively wide channel of a second conductivity type;

said detector transistors being coupled together and biased to provide, in the absence of an event, a first logic state output;

such that, when a transient event creates a current pulse condition, the current pulse induced in said wide-channel detector transistor is significantly greater than the current pulse induced in said narrow-channel transistor, thereby causing the output of said detector transistors to switch to a second logic state, providing an event signal.

4. The transient event detector of claim 3, wherein the transient event comprises a radiation dose.

5. The transient event detector of claim 3, wherein the event signal is used to place the integrated circuit in a predetermined state during the current pulse condition.

6. The transient event detector of claim 5, wherein the integrated circuit includes a memory, and wherein the event signal is used to disable memory WRITE operations, preventing transient event-induced memory WRITE operations.

7. The transient event detector of claim 3, further comprising a transition circuit responsive to the event signal for sharpening the transition to an event signal condition and connected to the output of said detector transistors.

8. The transient event detector of claim 7, wherein said transition circuit comprises an inverter that switches states upon receipt of an event signal and connected to the output of said detector transistors.

9. The transient event detector of claim 3, wherein said wide-channel transistor comprises:

multiple parallel transistors, each of which can be selectively coupled to said narrow-channel transistor;

such that the total wide-channel width, and therefore, the threshold level of current pulse necessary to cause an event signal, is determined by selecting the number of such parallel transistors that are incorporated into the transient event detector.

10. The transient event detector of claim 9, wherein the mechanism for selectively coupling said parallel transistors comprises a fusible link associated with each such transistor.

11. The transient event detector of claim 3, further comprising a time-delay circuit fabricated onto the chip, responsive to the event signal for providing, after a predetermined time-delay, a reset signal.

12. The transient event detector of claim 3, further comprising an event circuit responsive to the event signal for storing an indication of the occurrence of the event signal.

13. The transient event detector of claim 3, wherein said detector transistors are biased such that, in the absence of an event, said narrow-channel transistor is on and said wide-channel transistor is off.

14. The transient event detector of claim 13, wherein:
said narrow-channel transistor is a p-channel FET coupled gate-to-ground and source-to-VCC;
said wide-channel transistor is an n-channel FET coupled gate-to-ground and source-to-ground;
said transistors being coupled drain-to-drain, with the event signal appearing on such drains.

15. The transient event detector of claim 13, wherein:
said narrow-channel transistor is an n-channel FET coupled gate-to-VCC and source-to-ground;
said wide-channel transistor is a p-channel FET coupled gate-to-VCC and source-to-VCC;
said transistors being coupled drain-to-drain, with the event signal appearing on such drains.

16. The transient event detector of claim 13, wherein:
said narrow-channel transistor is a p-channel FET coupled gate-to-drain and source-to-VCC;
said wide-channel transistor is an n-channel FET coupled gate-to-ground and source-to-ground;
said transistors being coupled drain-to-drain, with the event signal appearing on such drains.

17. An on-chip bi-stable transient event detector for providing an event signal upon the occurrence of a transient event causing a current pulse condition in the integrated circuit chip, comprising:

at least two narrow-channel transistors fabricated onto the chip with a relatively narrow channel of opposite conductivity types; and at least two wide-channel transistors fabricated onto the chip with a relatively wide channel of opposite conductivity types;

said detector transistors being coupled together as a bi-stable circuit and biased to provide, in the absence of an event, a first logic state output;

such that, when a transient event creates a current pulse condition, the current pulses induced in said wide-channel detector transistors is significantly greater than the current pulses induced in said narrow-channel transistors, thereby causing the output of said bi-stable detector transistors to switch to a second logic state, providing an event signal.

18. The bi-stable transient event detector of claim 17, wherein the transient event comprises a radiation dose.

19. The bi-stable transient event detector of claim 17, wherein the event signal is used to place the integrated circuit in a predetermined state during the current pulse condition.

20. The bi-stable transient event detector of claim 19, wherein the integrated circuit includes a memory, and wherein the event signal is used to disable memory WRITE operations, preventing transient event-induced memory WRITE operations.

21. The bi-stable transient event detector of claim 17, further comprising a time-delay circuit fabricated on the chip, responsive to the event signal for providing, after a predetermined time-delay, a reset signal to said bi-stable circuit to reset said bi-stable circuit output to said first logic state.

22. The bi-stable transient event detector of claim 21, wherein said time-delay circuit comprises:
   a narrow-channel transistor with a relatively narrow channel of a first conductivity type;
   a wide-channel transistor with a relatively wide channel of a second conductivity type;
   said transistors being coupled together and to said bi-stable circuit as an inverter-pair, and being biased to provide a second logic state output which is the inverse of the first logic state output from said bi-stable circuit;
   such that, when a transient event creates a current pulse condition that causes said bi-stable circuit to switch it to the second output logic state, the current pulse induced in said wide-channel transistor is significantly greater than the current pulse induced in said narrow-channel transistor, thereby preventing the output of said inverter-pair transistors from switching to the first logic state until after the current pulse condition; and
   a time-delay element responsive to the output of said inverter-pair transistors to provide, after a predetermined time-delay, a reset signal to said bi-stable circuit.

23. The bi-stable transient event detector of claim 17, wherein said bi-stable circuit comprises:
   a narrow p-channel FET coupled source-to-VCC;
   a wide n-channel FET coupled source-to-ground;
   said narrow p and wide n-channel FETs being coupled gate-to-gate and drain-to-drain;
   a wide p-channel FET coupled source-to-VCC;
   a narrow n-channel FET coupled source-to-ground;
   said wide p and narrow n-channel FETs being coupled gate-to-gate and drain-to-drain;
   said narrow p and wide n-channel FETs being coupled to the other narrow p and wide n-channel FETs gates-to-drains.

24. The bi-stable transient event detector of claim 17, further comprising an event circuit connected to the output of said bi-stable detector transistors and responsive to the event signal for storing an indication of the occurrence of the event signal.

25. A method of detecting a transient event causing a current pulse condition in an integrated circuit chip and providing an event signal, comprising:
   fabricating onto the chip at least one narrow-channel transistor with a relatively narrow channel of a first conductivity type; and
   fabricating onto the chip at least one wide-channel transistor with a relatively wide channel of a second conductivity type;
   coupling and biasing said detector transistors to provide, in the absence of an event, a first logic state output;
   providing an event signal when a transient event creates a current pulse condition such that the current pulse induced in said wide-channel detector transistor is significantly greater than the current pulse induced in said narrow-channel transistor, thereby causing the output of said detector transistors to switch to a second logic state.

26. The method of detecting a transient event of claim 25, wherein the transient event comprises a radiation dose.

27. The method of detecting a transient event of claim 25, further comprising the step of placing the integrated circuit in a predetermined state during the current pulse condition.

28. The method of detecting a transient event of claim 27, wherein the integrated circuit includes a memory, further comprising the step of disabling memory WRITE operations in response to the event signal, preventing transient event-induced memory WRITE operations.

29. The method of detecting a transient event of claim 25, wherein the step of fabricating at least one wide-channel transistor comprises the steps:
   fabricating multiple parallel transistors;
   selectively coupling a number of such parallel transistors to said narrow-channel transistor to establish a composite wide-channel that determines the threshold current pulse level necessary to cause an event signal.

30. The transient event detector of claim 29, wherein the step of selectively coupling a number of parallel transistors comprises the step of selectively fusing a fusible link associated with each such transistor.

31. The method of detecting a transient event of claim 25, further comprising the step of providing, after a predetermined time-delay, a reset signal in response to the event signal.

32. The method of detecting a transient event of claim 25, further comprising the step of storing an indication of the occurrence of the event signal.

* * * * *